United States Patent
Jung et al.

(10) Patent No.: US 7,460,418 B2
(45) Date of Patent: Dec. 2, 2008

(54) SEMICONDUCTOR MEMORY DEVICE FOR STACK PACKAGE AND READ DATA SKEW CONTROL METHOD THEREOF

(75) Inventors: Won-chang Jung, Gunpo-si (KR);
Hi-choon Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 19 days.

(21) Appl. No.: 11/746,734

(22) Filed: May 10, 2007

(65) Prior Publication Data

US 2008/0043548 A1 Feb. 21, 2008

(30) Foreign Application Priority Data

Jun. 23, 2006 (KR) .................. 10-2006-0057087

(51) Int. Cl.
*G11C 8/00* (2006.01)
(52) U.S. Cl. ........................ 365/194; 365/233
(58) Field of Classification Search ............. 365/210.11
See application file for complete search history.

(56) References Cited

U.S. PATENT DOCUMENTS

| 5,627,794 | A | * | 5/1997 | Lee | ................. 365/233.1 |
| 5,715,212 | A | * | 2/1998 | Tanida et al. | ............. 365/233.5 |
| 5,760,478 | A | | 6/1998 | Bozso et al. | |
| 6,388,945 | B2 | * | 5/2002 | Aikawa | ................. 365/233.11 |
| 6,778,448 | B2 | * | 8/2004 | Kurosaki | ................. 365/194 |

FOREIGN PATENT DOCUMENTS

| KR | 1020020039210 A | 5/2002 |
| KR | 1020030023341 A | 3/2003 |

* cited by examiner

*Primary Examiner*—Tan T. Nguyen
(74) *Attorney, Agent, or Firm*—F. Chau & Assoc., LLC

(57) ABSTRACT

A semiconductor memory device and a read data skew control method thereof, in which a point of time when read data is output can be controlled using pad bonding in stack packages. The semiconductor memory device includes a bonding option pad and a delay control circuit that controls the point of time when data is output from an output buffer depending on logic states of a signal applied to the bonding option pad. Thus, when using the semiconductor memory device in stack packages, the read data skew generated as a result of a load on a bonding wire can be compensated by connecting the bonding option pad to ground voltage or a supply voltage.

11 Claims, 3 Drawing Sheets

SEMICONDUCTOR MEMORY DEVICE FOR STACK PACKAGE AND READ DATA SKEW CONTROL METHOD THEREOF

CROSS-REFERENCE TO RELATED PATENT APPLICATION

This application claims the benefit of Korean Patent Application No. 10-2006-0057087, filed on Jun. 23, 2006, in the Korean Intellectual Property Office, the disclosure of which is incorporated herein in its entirety by reference.

BACKGROUND OF THE INVENTION

1. Technical Field

The present disclosure relates to a semiconductor memory device and, more particularly, to a semiconductor memory device for a stack package and a read data skew control method thereof.

2. Discussion of Related Art

A package consisting of at least two semiconductor memory devices, that is, at least two semiconductor memory chips, is called a stack package. FIG. 1 is a schematic showing of a stack package. As shown in FIG, 1, a top memory chip 11 is disposed above a bottom memory chip 13. An output pad PAD of the top memory chip 11 is connected to a ball 15 by means of a bonding wire 14. Another output pad PAD of the bottom memory chip 13 is connected to a ball 17 by means of a bonding wire 18, and the bail 15 is connected to the ball 17 by means of a bonding wire 19.

When the ball 17 is used for data output, for example, read data from the bottom memory chip 13 is output through the relatively short bonding wire 18, and read data from the top memory chip 11 is output through a relatively longer bonding wire, that is, the bonding wire 14 plus the bonding wire 19. Accordingly, the load of the bonding wire 19 is added to the output pad of the top memory chip 11, which is not the case for the output pad of the bottom memory chip 13. Therefore, read data from the top memory chip 11 is output hundreds of pico-seconds slower than read data from the bottom memory chip 13.

As a result, the overall read time, that is, from the point of time when an external clock signal is applied to a memory chip to the point of time when the read data is output, of the top memory chip 11 is longer than the overall read time of the bottom memory chip 33. This reduces a valid section of the data read from the top memory chip 11, as well as a time margin for data fetch in a memory controller that receives the read data.

To compensate the read data skew, that is, the time skew between the read data from the top memory chip 13 and the read data from, the bottom memory chip 13, a fuse for compensating for the read data skew can be included in a semiconductor memory chip. The points of time when data is output from the top memory chip or the bottom memory chip can be controlled by distinguishing the top memory chip and the bottom memory chip in fusing steps using the fuse. Alternatively, the points of time when data is output can be controlled after packaging using an electrical fuse (E-Fuse).

The use of a fuse is limited, however, in that fusing should be performed prior to packaging after the top memory chip and the bottom memory chip are distinguished as such in advance, and the use of an E-Fuse has problems in terms of reliability.

SUMMARY OF THE INVENTION

Exemplary embodiments of the present invention provide a semiconductor memory device that can control the points of time when read data is output using a pad bonding in a stack package.

Exemplary embodiments of the present invention also provide a method of controlling read data skew.

According to an exemplary embodiment of the present invention, there is provided a semiconductor memory device comprising: an output buffer that receives read data in response to an output control clock signal and outputs the read data to the exterior; a bonding option pad; and a delay control circuit that controls the points of time when data is output from the output buffer according to the logic state of the signal applied to the bonding option pad.

According to an exemplary embodiment, the delay control circuit controls the read data to be output locked with an external clock signal applied from outside the device when the logic state of the signal applied to the bonding option pad is at a first logic level, and controls the read data to be output faster than the external clock signal when the logic state of the signal applied to the bonding option pad is at a second logic level.

According to an exemplary embodiment the delay control circuit delays the internal clock for a first delay time when the logic state of the signal applied on the bonding option pad is at a first logic level and provides it as the output control clock level, and delays the internal clock for a second delay time when the logic state of the signal applied to the bonding option pad is at a second logic level and provides it as the output control clock signal.

The first delay time is the same as the delay time of a compensation delay unit that is included in the delay locked loop, and the second delay time is shorter than the delay time of the compensation delay unit. The second delay time of the second delay unit is decreased or increased depending upon whether a fuse is cut or not in a fuse option circuit.

In an exemplary embodiment of the present invention, there is provided a data skew control method in a semiconductor memory device having an output buffer and a bonding option pad comprising: outputting read data from the output buffer locked with an external clock signal when the logic state of the signal applied on the bonding option pad is at a first logic level; and changing the point of time when data is output and outputting the read data when the logic state of the signal applied to the bonding option pad is at a second logic level.

According to an exemplary embodiment changing the points of time when data is output and outputting the read data comprises outputting the read data faster than the external clock signal when the logic state of the signal applied to the bonding option pad is at the second logic level.

In an exemplary embodiment, outputting read data from the output buffer locked with the external clock signal, comprises: delaying the internal clock for a first delay time when the logic state of the signal applied to the bonding option pad is at a first logic level; providing the first internal clock signal delayed for the first delay time; and outputting the read data from the output buffer in response to the first internal clock signal.

In such an exemplary embodiment, changing the points of time when data is output and outputting the read data comprises: delaying the internal clock signal for a second delay time when the logic state of the signal applied to the bonding option pad is at a second logic level; providing the second internal clock signal delayed for the second delay time to the output buffer; and outputting the read data from the output buffer in response to the second internal clock signal.

The first delay time is the same as the delay time of the compensation delay unit and the second delay time is shorter than the delay time of the compensation delay unit. The second delay time of the second delay unit is decreased or increased depending whether a fuse is cut or not in a fuse option circuit.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

The present invention will now be described more fully with reference to the accompanying drawings in which an exemplary embodiment of the invention is shown.

Figure 2:
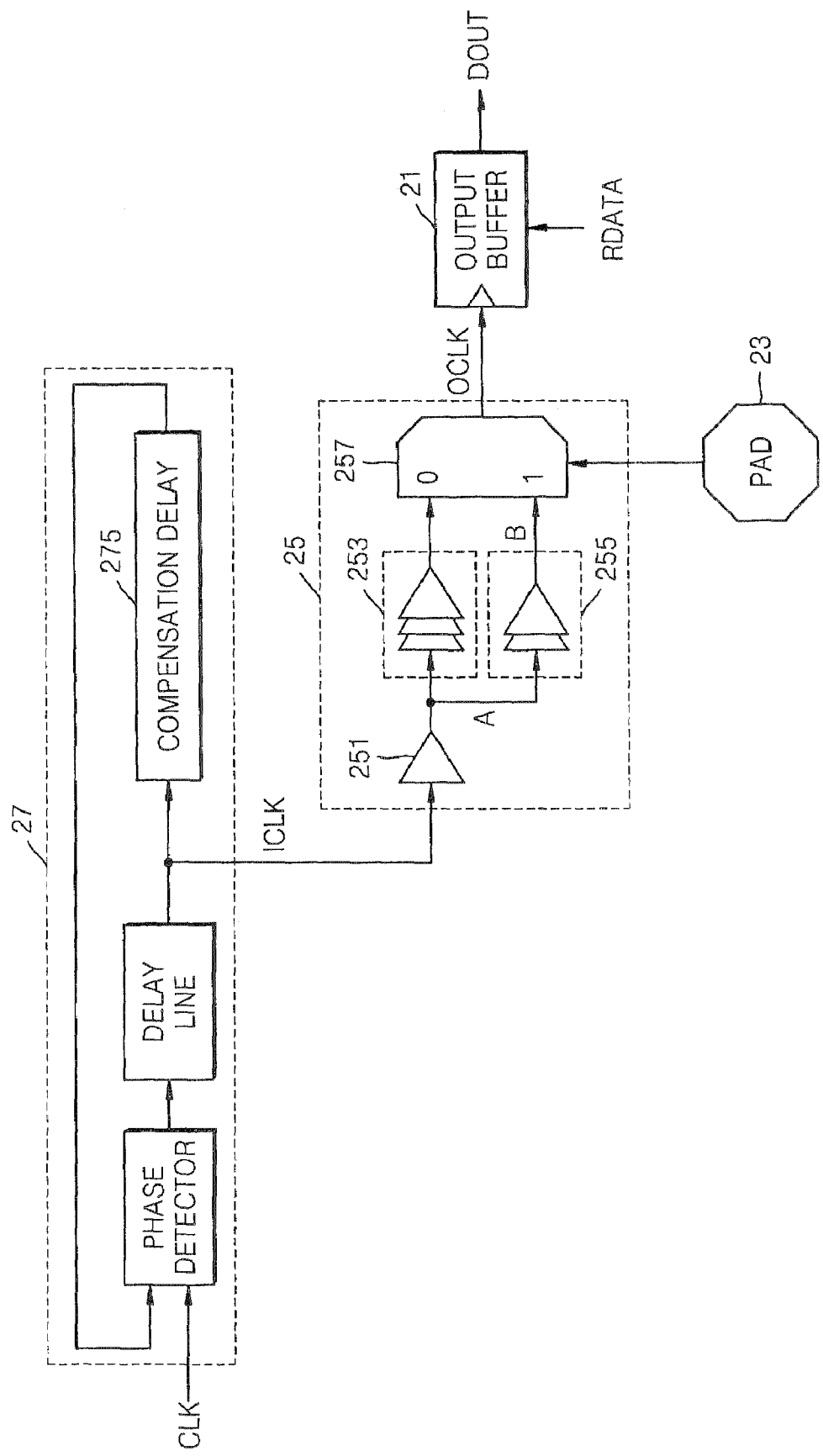
FIG. 2 is a block diagram showing a semiconductor memory device according to an exemplary embodiment of the present invention.

FIG. 2 is a block diagram showing a semiconductor memory device according to an exemplary embodiment of the present invention.

Referring to FIG. 2, the semiconductor memory device according to the exemplary embodiment of the present invention includes an output buffer 21 that receives and outputs the read data (RDATA) fed thereto in response to an output control clock (OCLK) and, more specifically, a delay control circuit 25 controls the points of time when data is output from tire output buffer 21 according to logic states of the signals applied to a bonding option pad 23 to compensate for the read data skew in a stack package.

The semiconductor memory device also includes a delay locked loop 27 (DLL) that generates an internal clock (ICLK) receiving an external clock signal (CLK) applied from outside the semiconductor memory device. The read data (RDATA) input to the output buffer 21 is data read from a memory cell array (not shown). The semiconductor memory device according to the exemplary embodiment operates according to methods for controlling the read data skew.

More specifically, referring back to FIG. 1 the length of the bonding wire 19 is approximately pre-determined, that is, it is known, and accordingly the read data time skew, that is, the data skew between the read data from the top memory chip 11 and the read data from the bottom memory chip 13 is approximately pre-determined in the stack package shown in FIG. 1. In addition, it is useful to distinguish between the top memory chip and the bottom memory chip when packaging is performed. Therefore, in the exemplary embodiment, the point of time when data is output from the output buffer 21 is controlled by distinguishing between the top memory chip and the bottom memory chip using a pad bonding option when packaging is performed.

In semiconductor memory devices using the DLL 27, the DDL 27 includes a compensation delay unit 275 that replicates a data output path delay of the delay control circuit 25 for the RDATA that is locked with the clock signal CLK. Accordingly, by differentiating the delay time of the compensation delay unit 275 and the delay time of the data output path delay, which corresponds to the delay time in the delay control circuit 25 in FIG. 2, the point of time when data is output from the output buffer 23 can be changed.

Using this mechanism, the delay control circuit 25 is formed so as to delay the signal ICLK for a first delay time that is the same as the delay time of the compensation delay unit 275 and provides it as a signal OCLK when the logic state of the signal applied to the bonding option pad 23 is at a first logic level, for example, logic LOW, and delays the signal ICLK for a second delay time that is shorter than the delay time of the compensation delay unit 275 and provides it as the signal OCLK when the logic state of the signal applied to the bonding option pad 23 is at a second logic level, for example, logic HIGH.

Therefore, the delay control circuit 25 controls the RDATA to be output locked with the signal CLK when the logic state of the signal applied to the bonding option pad is logic LOW, and to be output earlier than the signal CLK when the logic state of the signal applied to the bonding option pad is logic HIGH.

Figure 1:
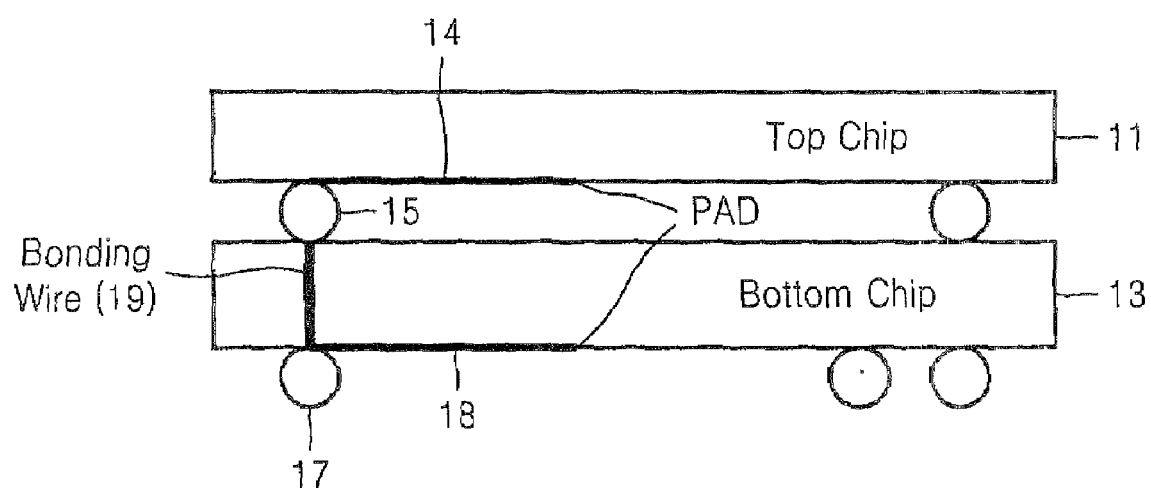
FIG. 1 is a schematic showing a known stack package.

The difference between the first delay time and the second delay time can be set in consideration of the degree of compensation necessary for the read data skew generated as a result of the load on the bonding wire 19 in the stack package shown in FIG 1.

The delay control circuit 25 can be formed so as to include a buffer 251, a first delay unit 253, a second delay unit 255, and a selector 257. The buffer 251 performs buffering receiving the signal ICLK generated by the DLL 27. The first delay unit 253 delays the buffered signal ICLK for the first delay time, and the second delay unit 255 delays the buffered signal ICLK for the second delay time. The selector 257 selects the output signal of the first delay unit 253 and provides it as the signal OCLK when the logic state of the signal applied to the bonding option pad 23 is logic LOW, and selects the output signal of the second delay unit 255 and provides it as the signal OCLK when the logic state of the signal is logic HIGH. In this exemplary embodiment, delay times of the buffer 251 and the selector 257 are assumed to be nearly zero.

Therefore, when the semiconductor memory device according to the exemplary embodiment is used as the bottom memory chip 13 in the stack package shown in FIG. 1, the bonding option pad 23 is connected to VSS (ground) when packaging is performed, and when the semiconductor memory device is used as the top memory chip 11, the bonding option pad 23 is connected to VDD (supply voltage) when packaging is performed. Thus, in the semiconductor memory device according to the exemplary embodiment, when the bottom memory chip 13 is used, the RDATA is output locked with the input clock signal CLK, and in the semiconductor memory device according to the exemplary embodiment when the top memory chip 11 is used, the RDATA is output faster than the input clock signal CLK.

As a result, the read data skew generated because of the load on the bonding wire 19 in the stack package shown in FIG, 1, that is, the skew between the data read from the top memory chip 11 and the data read from the bottom memory chip 13 is compensated for. That is, as the data read from the top memory chip 11 through the ball 15 is output faster than the input clock signal CLK, and as the data read from the top memory chip 11 is delayed due to the load on the bonding wire 19, the delayed read data becomes almost locked with the signal CLK at the point where data is output from the ball 17.

In the above process, the read data skew, that is, the skew between the data read from the top memory chip 11 and the data read from the bottom memory chip 13 is assumed to be approximately predetermined in the stack package shown in FIG. 1. The value of the read data skew, however, can vary slightly according to changes, such as a process change. In such cases, the second delay unit 255 shown in FIG. 2 is formed using a fuse option as shown in FIG. 3, so that the second delay time, that is, the delay time of the second delay unit 255 for compensating for the read data skew can be appropriately tuned.

Figure 3:
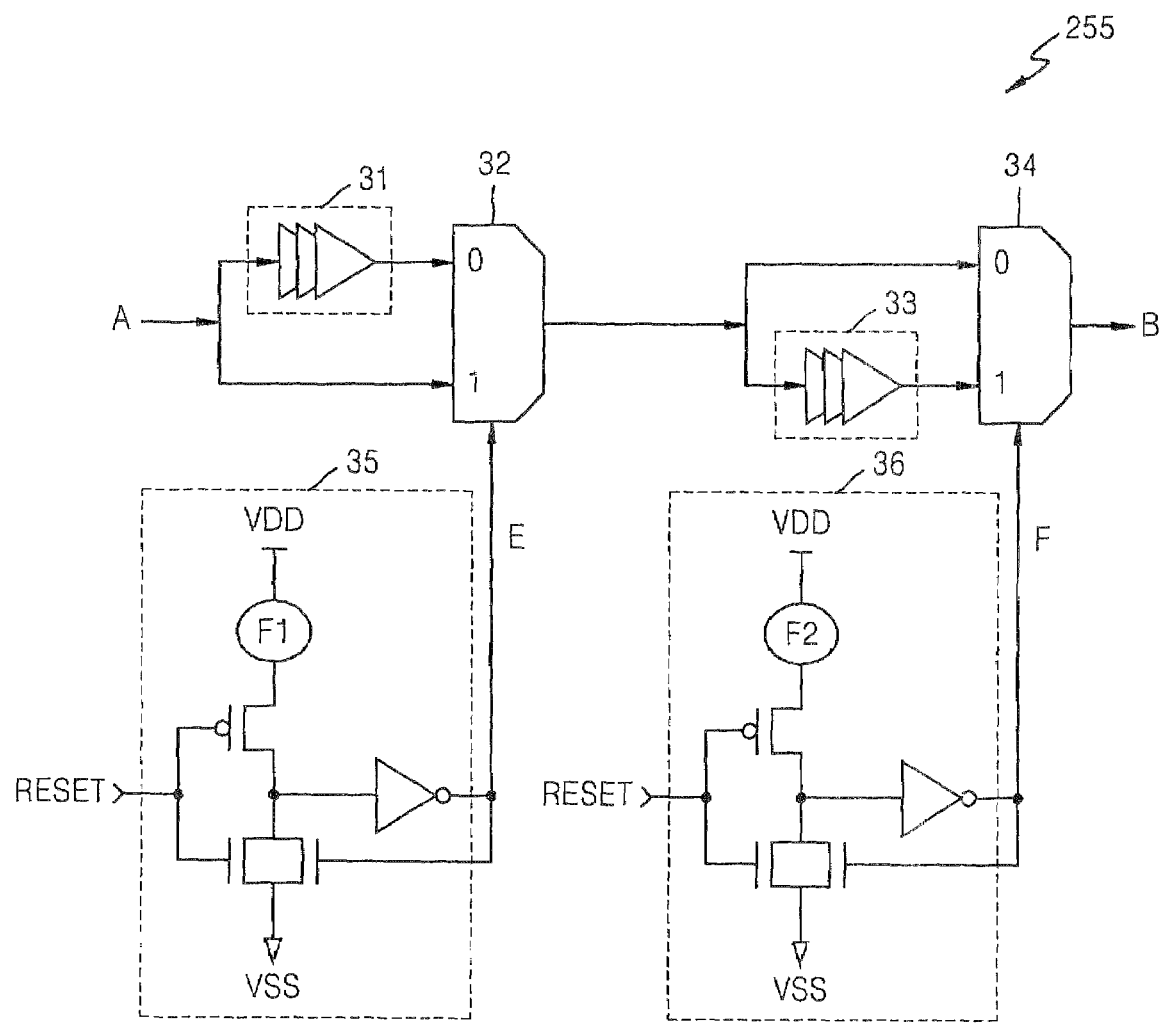
FIG 3 is a circuit diagram showing an exemplary second delay unit shown in FIG. 2, which has a fuse option.

Referring to FIG. 3, the second delay unit 255 includes a first delay unit 31, a first selector 32, a second delay unit 33, a second selector 34, a first fuse option circuit 35, and a second fuse option circuit 36.

The reset signal RESET is a signal indicating a transition from a logic HIGH level to a logic LOW level so as to initialize internal registers when the semiconductor memory device initially begins to operate. If a fuse F1 is not cut, the output signal E of the first fuse option circuit 35 turns to a logic LOW level and the first selector 32 selects and outputs the signal A that is delayed by the first delay unit 31. If the fuse F1 is cut, the output signal E of the first fuse option circuit 35 turns to a logic HIGH level and the first selector 32 selects and outputs the signal A that is not delayed by the first delay unit 31.

Similarly, if a fuse F2 is not cut, the output signal F of the second fuse option circuit 36 turns to a logic LOW level and the second selector 34 selects and outputs the signal that is not delayed, that is, the output signal of the first selector 32 as signal B. If the fuse F2 is cut the output signal F of the second fuse option circuit 36 turns to a logic HIGH level and the second selector 34 selects and outputs the output signal of the first selector 32 that is delayed by the second delay unit 33 as signal B.

Therefore, the delay time of the second delay unit 255 can be decreased or increased depending on whether each of the fuses F1 and F2 is cut.

As described above, in the semiconductor memory device that operates according to the read data skew control method according to an exemplary embodiment of the present invention, the point of time when data is output can be controlled using pad bonding in the stack package. Therefore, by using the semiconductor memory device according to an exemplary embodiment of the present invention in stack packages, the read data skew generated as a result of the load on the bonding wire can be compensated for.

While the present invention has been particularly shown and described with reference to exemplary embodiments thereof, it will be understood by those of ordinary skill in the art that various changes in form and details may be made therein without departing from the spirit and scope of the present invention, as defined by the following claims.

What is claimed is:

1. A semiconductor memory device comprising:
   an output buffer that receives read data to be output in response to an output control clock signal and outputs the read data to the exterior;
   a bonding option pad; and
   a delay control circuit that controls a point of time when data is output from the output buffer according to a logic state of a signal applied to the bonding option pad.

2. The device of claim 1, wherein the delay control circuit controls the read data to be output locked with an external clock signal applied from outside the device when the logic state of the signal applied to the bonding option pad is a first logic level, and controls the read data to be output faster than the external clock signal when the logic state of the signal applied to the bonding option pad is second logic level.

3. The device of claim 1, wherein the delay control circuit delays an internal clock signal for a first delay time when the logic state of the signal applied on the bonding option pad is a first logic level and provides the delayed internal clock signal as the output control clock level, and delays the internal clock signal for a second delay time when the logic state of the signal applied to the bonding option pad is a second logic level and provides the delayed internal clock signal as the output control clock signal.

4. The device of claim 3, wherein the delay control circuit comprises:
   a first delay unit that delays the internal clock signal for the first delay time;
   a second delay unit that delays the internal clock signal for the second delay time; and
   a selector that selects the output signal of the first delay unit and provides the output signal of the first delay unit as the output control clock signal when the logic state of the signal applied to the bonding option pad is the first logic level and selects the output signal of the second delay unit and provides tire output signal of tire second delay unit as the output control clock signal when the logic state of the signal applied to the bonding option pad is tire second logic level.

5. The device of claim 4, wherein the second delay time of the second delay unit is decreased or increased depending on whether a fuse in a fuse option circuit is cut.

6. The device of claim 3, further comprising a delay locked loop that receives the external clock signal applied from outside the semiconductor memory device and generates the internal clock signal,
   wherein the first delay time is the same as a delay time of a compensation delay unit that is included in the delay locked loop,
   and the second delay time is shorter than the delay time of the compensation delay unit.

7. A read data skew control method in a semiconductor memory device including an output buffer and a bonding option pad, the method comprising:
   outputting read data from the output buffer locked with an external clock signal when a logic state of a signal applied to the bonding option pad is at a first logic level; and
   changing the point of time when data is output and outputting the read data when the logic state of the signal applied to the bonding option pad is at a second logic level.

8. The read data skew controlling method of claim 7, wherein changing the point of time when data is output and outputting the read data comprises outputting the read data faster than the external clock signal when the logic state of the signal applied to the bonding option pad is at the second logic level.

9. The read data skew controlling method of claim 7, wherein outputting read data from the output buffer locked with the external clock signal, comprises:
   delaying an internal clock based on the external clock for a first delay time when the logic state of the signal applied to the bonding option pad is at the first logic level;
   providing the first internal clock signal delayed for the first delay time; and
   outputting the read data from the output buffer in response to the internal clock signal delayed by the first delay time.

10. The read data skew controlling method of claim 9, wherein changing the point of time when data is output and outputting the read data comprises:

delaying the internal clock signal for a second delay time when the logic state of the signal applied to the bonding option pad is at the second logic level;

providing the second internal clock signal delayed for the second delay time to the output buffer; and outputting the read data from the output buffer in response to the internal clock signal delayed by the second delay time.

11. The read data skew controlling method of claim 10, wherein the semiconductor memory device further comprises a delay locked loop that receives the external clock signal applied from outside the device and generates the internal clock signal, wherein the first delay time is the same as a delay time of a compensation delay unit included in the delay locked loop and the second delay time is shorter than the delay time of the compensation delay unit.

* * * * *